(12) United States Patent
Kar et al.

(10) Patent No.: US 11,004,898 B2
(45) Date of Patent: May 11, 2021

(54) METHOD FOR MANUFACTURING A MAGNETIC TUNNEL JUNCTION DEVICE AND DEVICE MANUFACTURED USING SUCH METHOD

(71) Applicant: IMEC vzw, Leuven (BE)

(72) Inventors: Gouri Sankar Kar, Leuven (BE); Stefan Cosemans, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/236,051

(22) Filed: Dec. 28, 2018

(65) Prior Publication Data

US 2019/0221608 A1 Jul. 18, 2019

(30) Foreign Application Priority Data

Dec. 29, 2017 (EP) .................................... 17211020

(51) Int. Cl.
*H01L 27/22* (2006.01)
*H01L 43/12* (2006.01)
*H01L 43/02* (2006.01)

(52) U.S. Cl.
CPC ............ *H01L 27/228* (2013.01); *H01L 43/02* (2013.01); *H01L 43/12* (2013.01)

(58) Field of Classification Search
CPC ........ H01L 27/228; H01L 43/02; H01L 43/12
USPC ....................................................... 257/421
See application file for complete search history.

(56) References Cited

U.S. PATENT DOCUMENTS

| | | | |
|---|---|---|---|
| 6,885,577 B2 * | 4/2005 | Tang | ....................... G11C 11/16 365/158 |
| 8,804,413 B2 | 8/2014 | Li et al. | |
| 9,076,539 B2 | 7/2015 | Kim et al. | |
| 9,087,983 B2 | 7/2015 | Guo | |

(Continued)

FOREIGN PATENT DOCUMENTS

| | | |
|---|---|---|
| EP | 2506264 B1 | 4/2014 |
| JP | 2012244079 A | 12/2012 |
| KR | 2015016797 A | 8/2013 |

OTHER PUBLICATIONS

Kim et al. A Covalent-Bonded Cross-Coupled Current-Mode Sense Amplifier for STT-MRAM with 1T1MTJ Commom Source-Line Structure Array, (2015).

(Continued)

*Primary Examiner* — Tu-Tu V Ho
(74) *Attorney, Agent, or Firm* — Knobbe Martens Olson & Bear, LLP

(57) ABSTRACT

A magnetic tunnel junction memory device is disclosed. In one aspect, the memory device comprises a substrate, a first memory element, and a second memory element, wherein the first memory element and the second memory element are formed of a stack comprising at least a first layer and a second layer, the first layer being arranged between the substrate and the second layer. The memory device further comprises a first selector device arranged to contact the first memory element, and a second selector device arranged to contact the second memory element, wherein the first selector device and the second selector device are arranged in or above the second layer. The first memory element and the second memory element are interconnected via the first layer, and are separated from each other by a trench formed in the second layer.

29 Claims, 3 Drawing Sheets

(56) References Cited

U.S. PATENT DOCUMENTS

| | | | |
|---|---|---|---|
| 9,373,775 B2 * | 6/2016 | Sandhu | H01L 43/08 |
| 2004/0257868 A1 * | 12/2004 | Tang | G11C 11/16 |
| | | | 365/173 |
| 2010/0157664 A1 | 6/2010 | Chung | |
| 2013/0187247 A1 | 7/2013 | Wu et al. | |
| 2013/0201757 A1 * | 8/2013 | Li | G11C 11/1659 |
| | | | 365/171 |
| 2014/0070342 A1 | 3/2014 | Sandhu et al. | |
| 2014/0103471 A1 * | 4/2014 | Lupino | H01L 27/224 |
| | | | 257/421 |
| 2014/0285226 A1 | 9/2014 | Li et al. | |
| 2015/0091110 A1 | 4/2015 | Kuo et al. | |
| 2017/0117027 A1 | 4/2017 | Braganca et al. | |

OTHER PUBLICATIONS

Zhao et al. Architecting a Common-Source-Line Array for Bipolar Non-Volatile Memory Devices, (2012).

Extended European Search Report for European Application No. 17211020.7 dated Jul. 4, 2018 by Eurpoean Patent Office.

* cited by examiner

METHOD FOR MANUFACTURING A MAGNETIC TUNNEL JUNCTION DEVICE AND DEVICE MANUFACTURED USING SUCH METHOD

CROSS-REFERENCE TO RELATED APPLICATIONS

This application claims foreign priority to European Application EP 17211020.7, filed on Dec. 29, 2017, which is incorporated herein by reference in its entirety.

BACKGROUND

Technological Field

The disclosed technology relates to the field of memory devices, and more specifically, to a magnetic tunnel junction (MTJ) device and a method of manufacturing such MTJ device.

Description of the Related Technology

There is a considerable interest in using spintronics to develop non-volatile magnetic memories. The storage element for such a technology is normally a magnetic tunnel junction (MTJ). The MTJ normally comprises two ferromagnetic (FM) layers separated by an insulating, or barrier, layer. If the insulating layer is thin enough, typically a few nanometers, electrons can tunnel from one ferromagnetic layer into the other. The resistance of the MTJ is dependent on the relative orientation of the magnetization of the two ferromagnetic layers. This mechanism is known as tunnel magnetoresistance (TMR). In an MTJ, the reading operation is operated by the TMR. The writing operation can be achieved by the spin-torque transfer (STT), representing a transfer of spin angular momentum from a reference FM layer to a free FM layer of the MTJ.

The MTJ elements are typically created by depositing layers that may serve different functionalities, for example, a pinned layer, a tunnel layer, and a free layer, and etching them into pillars. The pillars, which form the MTJ elements, may then be connected to a selector device arranged in the substrate. The etching of the MTJ stack is, however, known to be a challenging process, easily resulting in electrical shortcuts between the pinned layer and the free layer. This will degrade the performance of the memory device. Thus, an improved manufacturing process avoiding these drawbacks would be advantageous.

SUMMARY OF CERTAIN INVENTIVE ASPECTS

An objective of the disclosed technology is to provide an improved memory device. This and other objectives are achieved by disclosing aspects of a memory device and a method of manufacturing such device in the independent claims. Exemplary embodiments are also disclosed.

In one aspect, the disclosed technology relates to a memory device, comprising a substrate or supporting layer, a first memory element, and a second memory element, wherein the first memory element and the second memory element are formed of a stack comprising at least a first layer and a second layer, the first layer being arranged between the substrate and the second layer. The memory device further comprises a first selector device arranged to contact the first memory element and a second selector device arranged to contact the second memory element, wherein the first selector device and the second selector device are arranged in or above the second layer. Furthermore, the first memory element and the second memory element are interconnected via the first layer, and are separated from each other by a trench formed in the second layer.

In another aspect, the disclosed technology relates to a method of manufacturing a memory device. The method comprises providing a substrate or supporting layer, a first layer, and a second layer, wherein the first layer is arranged between the substrate and the second layer. The method further comprises etching through the second layer to form a first memory element and a second memory element, wherein the first memory element and the second memory element are interconnected via the first layer and separated from each other by a trench formed in the second layer. The method further comprises providing a first selector device arranged to contact the first memory element, and a second selector device arranged to contact the second memory element, wherein the first selector device and the second selector device are arranged in or above the second layer.

The disclosed technology allows for an improved structure of the memory device by enabling selector devices to be employed in or above the second layer. This is advantageous over architectures in which the selector devices are arranged in the substrate, since it allows for the selector devices to be formed in a subsequent process after the stack of the first and second layers is formed, or even after the memory elements have been formed. In other words, the selector devices may be formed in a back-end-of-line (BEOL) process instead of a front-end-of-line (FEOL) process. Whereas FEOL processing is associated with selector devices comprising, e.g., bulk silicon transistors, the BEOL processing is associated with other types of transistors such as thin film transistors, 2D material transistors and monolithic 3D integration. Another advantage is that by only etching the top layer and not the bottom layer, the process is much easier and more robust. To be able to use such partially etched memory elements in an area-efficient way, one needs to use selector devices physically located above the top layer, rather than below the bottom layer, as would normally be the case with devices in the silicon substrate.

A further advantage is that by arranging the selector devices above or at the same level as the memory elements (instead of in the substrate), the memory elements may be contacted from above and thereby be individually associated with a respective internal node at the top of the stack. This is advantageous over architectures in which the selector devices are arranged in the substrate, requiring the memory elements to be electrically separated all the way down to the substrate, or requiring contact via structures providing a connection between the substrate and the top level of the stack. Moreover, with this arrangement the memory elements may be jointly accessed from below, such that both the first memory element and the second memory element can be associated with a common, single, internal bottom node which can be used for, e.g., connecting the memory elements to power supply.

Reference to a layer, a device, or other elements being formed "above" a first feature such as a layer, a device, or other elements herein means that the second layer is formed above the first layer along (or as seen) in the vertical direction. As used herein, the term "in or above" means a layer, a device, or other elements being formed at the same level or above the other layer.

As used herein, a "stack" of layers means layers being arranged above or on top of each other, in the vertical direction.

The term "substrate" may, in the context of the present disclosure, generally refer to a supporting layer or structure on which the first and second layer may be provided. Examples of such structures may include a bulk silicon wafer used in semiconductor processing, an electrically insulating layer, and other layers arranged between a wafer and the first layer of the stack (e.g. comprising conventional logic transistors and BEOL interconnects).

It will also be appreciated that the term "trench" may refer to a recess or void structure that physically separates at least a part of the memory elements from each other. Thus, the trench may be realized as a feature that separates or cuts the second layer into two separate structures.

The term "interconnected" as used herein refers to a structural or integral connection by which the memory elements share a common structure. In addition, or as an alternative, the term may refer to a functional connection by which the first and second memory elements are functionally integrated with each other, for example, an electrical connection.

According to an embodiment of the disclosed technology, the device may further comprise a third layer arranged between the first and the second layer. The third layer may be used as an etch stop layer when etching through the second layer to form the first and second memory elements. Thus, only part of the stack may be etched in what may be referred to as a partial etching process. The partial etching is particularly advantageous to use when the stack comprises very thin and sensitive layers, such as the third layer, and for structures or arrays comprising a plurality of memory elements having a relatively small cell pitch requiring an increased etch uniformity and process stability. The partial etching may be enabled by an etch process that selectively etch only a specific material. In this case the material of the second layer may be selectively etched with respect to the material of the third layer. By not etching through the third layer, shortcuts may be avoided between the first and the second layer. Such shortcuts may otherwise appear when etching from one conductive layer to another conductive layer through a relatively thin insulating layer like the third layer. When etching through all layers, current may then bypass the insulating layer and thus impair the functionality of the memory device. As a result of the partial etching, the first memory element and the second memory element may be considered as (structurally) interconnected via the barrier layer.

The first layer may be a first magnetic layer, the second layer may be a second magnetic layer, and the third layer may be a barrier layer or tunneling layer, forming a magnetic tunnel junction (MTJ) structure. The memory device may thus be an MTJ memory device. The barrier layer may, in some examples, comprise one or several layers of a tunnel oxide. In some examples, the first magnetic layer may have a fixed magnetization direction and the second magnetic layer may be configured to switch its magnetization direction with respect to the magnetization direction of the first magnetic layer. Alternatively, the second magnetic layer may have a fixed magnetization direction and the first magnetic layer may be configured to switch its magnetization direction with respect to the magnetization direction of the second magnetic layer. Thus, the first and second magnetic layers may have a relative magnetic direction that can be altered between a parallel state and an opposing state so as to distinguish between to different logic states of the memory element.

The barrier layer may include a layer of dielectric material, such as Magnesium oxide (MgO), Aluminium oxide (AlO), Magnesium aluminium oxide (MgAlOx) or Magnesium titanium oxide (MgTiOx).

According to another embodiment of the memory device, each one of the first selector device and the second selector device may be a thin film device or a monolithic 3D integrated device. Thus, the selector devices may be formed using monolithic 3D integration, thin film transistor techniques such as IGZO, 2D material structures such as graphene or $MoS_2$, nano-electromechanical switches, carbon nanotube transistors, or other techniques compatible with BEOL processing, for example. The first selector device and the second selector device may comprise a planar transistor or a vertical transistor. Examples of vertical transistors may include vertical nanowires.

According to yet another embodiment of the memory device, each one of the first selector device and the second selector device may be a three terminal device having a first terminal connected to the second layer of its respective memory element, a second terminal connected to a respective bit line, and a third terminal connected to a respective word line. Furthermore, the first memory element and the second memory element may be connected, via the second layer, to a common source line. The common source line may, for example, be connected to, or realized as, the first layer of the stack. Thus, the first word line may be activated to address the first memory element and the second word line may be activated to address the second memory element. In other words, the internal node, or the top node between the selector device and the memory element, may be unique for each cell.

It is noted that the invention comprises all possible combinations of features recited in the claims. Furthermore, it will be appreciated that the various embodiments described for memory device according to the first aspect may all be combined with embodiments described for the manufacturing method according to the second aspect. Further objectives, features, and advantages of the invention will become apparent when studying the following detailed disclosure, the drawings, and the appended claims. Those skilled in the art will realise that different features of the invention can be combined to create embodiments other than those described in the following.

BRIEF DESCRIPTION OF THE DRAWINGS

The above, as well as additional objectives, features, and advantages of the invention will be better understood through the following illustrative and non-limiting detailed description, with reference to the appended drawings. In the drawings, like reference numerals will be used for like elements unless stated otherwise.

DETAILED DESCRIPTION OF CERTAIN ILLUSTRATIVE EMBODIMENTS

The invention will now be described more fully hereinafter with reference to the accompanying drawings, in which exemplary embodiments are shown. The invention may, however, be embodied in many different forms, and should not be construed as limited to the embodiments set forth herein; rather, these embodiments are provided as examples so that this disclosure will convey the scope of the invention to those skilled in the art. Furthermore, like numbers refer to the same or similar elements or structures throughout.

Figure 1:
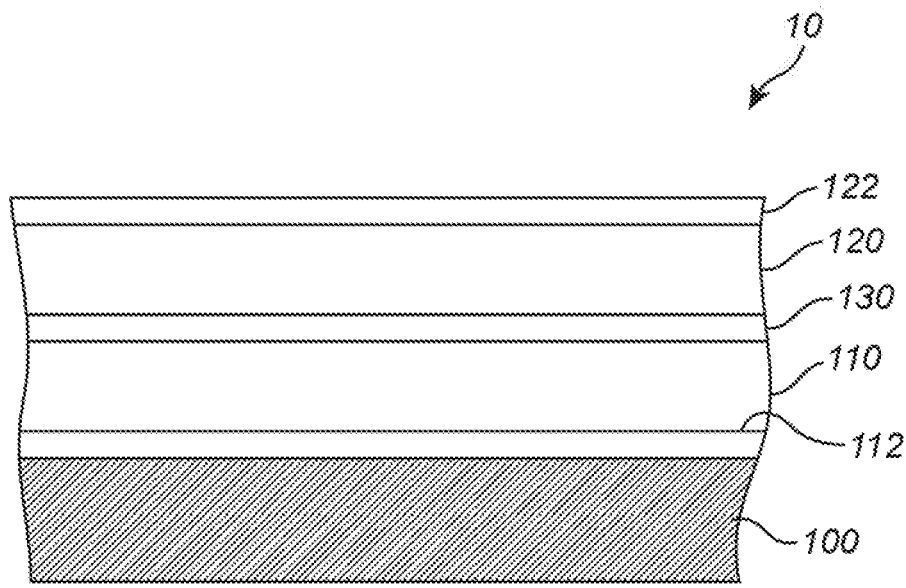
FIGS. 1-4 each shows, in a cross-sectional side view, a memory device according to certain embodiments.

With reference to FIG. 1, there is shown a cross-sectional side view of a substrate 100 and a stack comprising at least a first layer 110 and a second layer 120, wherein the first layer 110 is arranged between the substrate 100 and the second layer 120. Thus, the stack may be referred to as a vertical stack, in which the first layer 110 and the second layer 120 are arranged in a sequence above the substrate 100. It will, however, be appreciated that the illustrated stack according to the present figure is merely an example, and that the disclosed technology is applicable to a lateral arrangement as well.

As shown in FIG. 1, the stack may not be limited to only comprising the first layer 110 and the second layer 120. On the contrary, the stack may comprise further layers, such as a third layer 130 arranged between the first layer 110 and the second layer 120. Further layers may be provided, and/or be included in the first layer 110 and the second layer 120. Some examples will be illustrated in the following.

In some embodiments, the first layer 110 may be a first magnetic layer and the second layer 120 a second magnetic layer, both separated by a barrier layer 130 such that the resulting structure forms a magnetic tunnel junction (MTJ) structure. In such a structure, the first magnetic layer 110 may have a fixed magnetization direction, whereas the second magnetic layer 120 may have a magnetization direction that can be switched with respect of the magnetization direction of the first magnetic layer 110. The first magnetic layer 110 may in such configuration be referred to as a magnetic reference layer or pinned layer, and the second magnetic layer 120 as a magnetic free layer. It should, however, be noted that the order of the magnetic reference layer 110 and the free layer 120 may be reversed such that the magnetic reference layer is arranged above the magnetic free layer in the stack, i.e., such that the magnetic free layer 120 is the one arranged closest to the substrate 100. The magnetic reference layer 110 and the magnetic free layer 120 may have perpendicular magnetic anisotropy, with a direction that can be altered between, e.g., two mutually opposing directions in the magnetic free layer 120.

The first layer 110 and the second layer 120 may be formed of a material comprising CoFeB. The CoFeB may be arranged in one or several layers in the first layer 110 and/or the second layer 120. Further examples of materials for the first and/or second layers 110 and 120 include Fe, Co, CoFe, FeB, Ni, FePt, CoGd, CoFeGd, CoFeTb, and CoTb.

The third layer 130, which may be a barrier or tunneling layer 130 allowing tunneling of electrons between the first layer 110 and the second layer 120. The barrier layer 130 includes a layer of dielectric material, for instance, MgO, AlOx, MgAOx, or MgTiOx.

The MTJ stack formed of the first layer 110, the barrier layer 130, and the second layer 120 may be provided between a bottom electrode layer 112 and a top electrode layer 122 to provide an electrical connection of the resulting memory elements.

Figure 2:
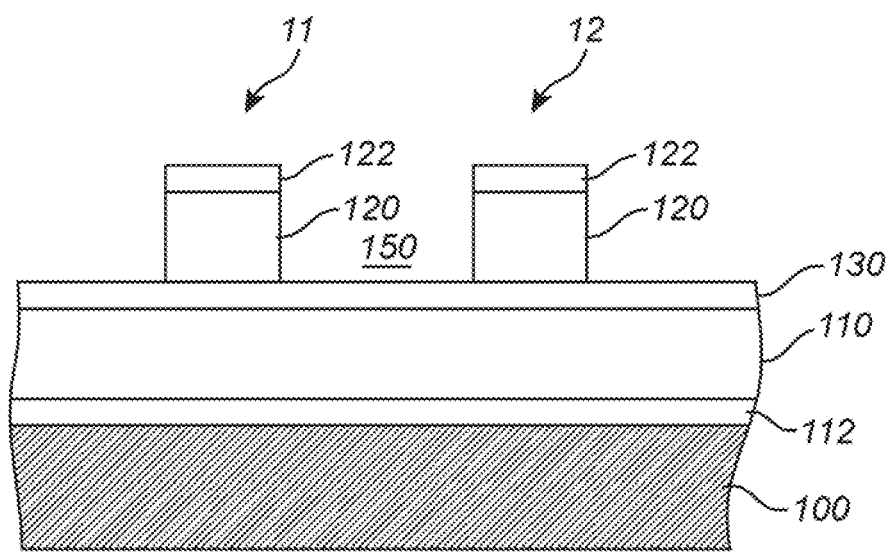

With reference to FIG. 2, there is shown a structure similar to the one in FIG. 1, comprising a substrate 100 and a stack of at least a first layer 110 and a second layer 120. However, in the present example, a trench 150 has been formed in the second layer 120, thereby defining a first memory element 11 and a second memory element 12. As shown in the present figure, the memory elements 11 and 12 may be structurally separated from each other, or arranged spaced apart from each other in the lateral direction, separated by the intermediately arranged trench 150.

Furthermore, the first memory element and the second memory element, 11 and 12, may still be interconnected at least via the first layer 110, i.e., the layer defining the "bottom" of the trench 150 (as illustrated in the exemplary vertical configuration). The term "interconnected" may thus refer to a structural or integral connection by which the memory elements 11 and 12 share a common structure. In addition, or as an alternative, the term may refer to a functional connection in which the first and second memory elements 11 and 12 are functionally integrated with each other, for example, an electrical connection. Consequently, it may be possible to individually access or address the memory elements 11 and 12 from "above", i.e., via the top electrode 122, such that the first memory element 11 and the second memory element 12 can be associated with individual internal nodes, wherein the bottom electrode 112 can be common to both memory elements (or cells) 11 and 12.

The structure disclosed in FIG. 2 may be provided by an etching process, in which only a part of the stack is etched. In other words, the stack may not be etched all the way through down to the substrate, and the etching process may hence be referred to as a partial etch process. In the present example, the etching may be performed through the top electrode 122 and the second layer 120 down to the barrier layer 130, which may be used as an etch stop layer. Thus, the resulting structure may be a first pillar forming the first memory element 11 and a second pillar forming the second memory element 12, wherein the pillars are separated by the trench 150 extending through the top electrode 122 and the second layer 120, and are structurally interconnected by the barrier layer 130, the first layer 110, and the bottom electrode 112. It should be noted that the structure shown in FIG. 2 is merely an example illustrating, inter alia, the concept of the partial etch process that may be employed within the context of the disclosed technology.

Figure 4:
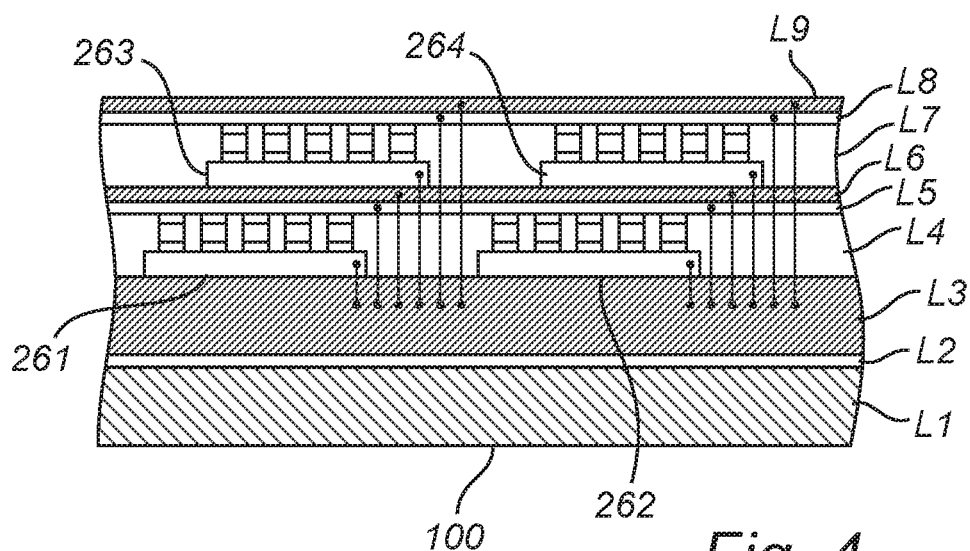

The partial etching is particularly advantageous for memory devices having a plurality of memory element, or cells, having a relatively small cell pitch, e.g. below 100 nm, since it is easier to achieve a uniform and well defined etch result when etching only partly through the stack, leaving the first layer 110 intact in larger regions or "plates". The memory elements, or pillars, may hence not be individually separated at the bottom of the stack, but arranged in larger, interconnected groups wherein each group share common plate (as shown in FIG. 4). The non-etched portions of the stack (such as the first layer 110 and the bottom electrode 112) that define a plate may comprise arrays of, e.g., 256×4000 cells sharing a common source line. Further examples may include 256×8 cells on one plate, or one source line for each bit line, such as 256 cells×1 cell on one source line.

The first and second memory elements 11 and 12 may be formed in a back-end-of-line (BEOL) process, which may be performed after the processing of the substrate, e.g., a bulk silicon substrate or a silicon-on-wafer substrate, has been finished.

Figure 3:
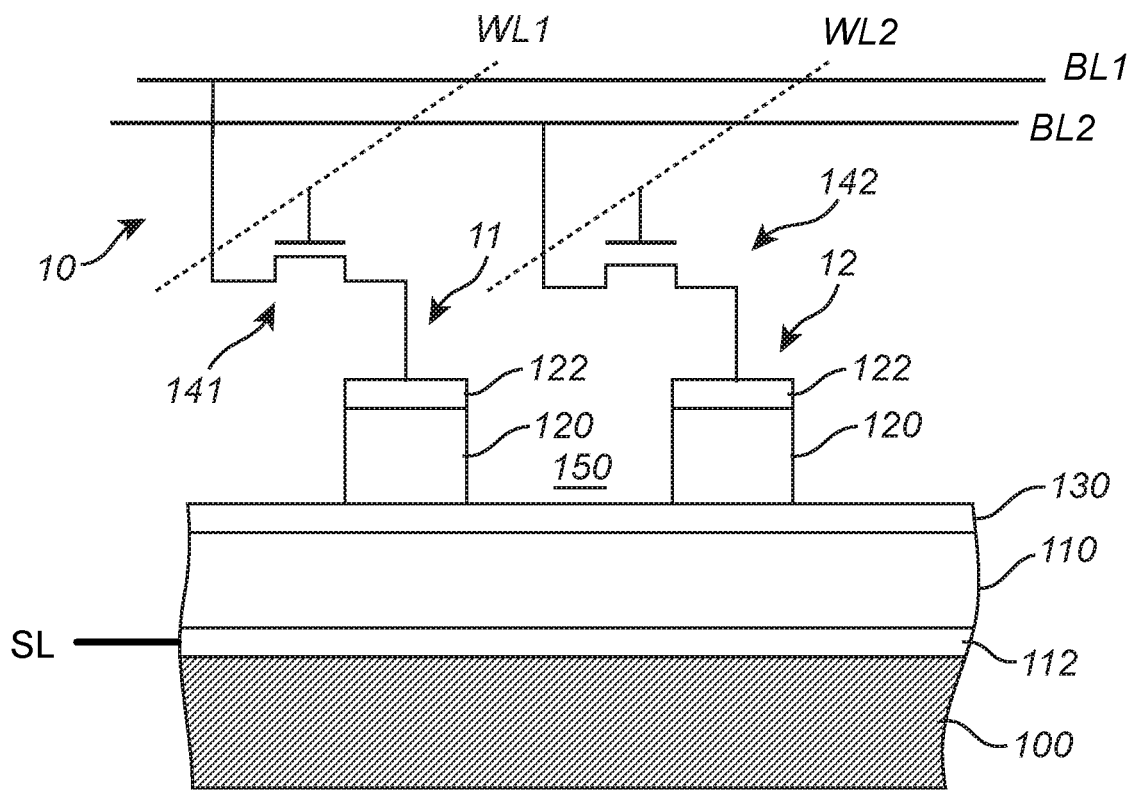

FIG. 3 shows a memory device 100 that may be similarly configured as the memory devices discussed above in connection with any of the previous embodiments. In the present embodiment, the memory device 100 may further comprise selector devices for controlling the access to the memory elements 11 and 12. As shown in FIG. 3, a first selector device 141 may be connected to the first memory element 11 and a second selector device 142 to the second memory element 12, preferably to the second layer 120 via the top electrode 122. The selector devices, 141 and 142, which in the present figure is schematically represented by a transistor symbol, may be formed using monolithic 3D integration, thin film transistor techniques such as IGZO, 2D material structures such as graphene or $MoS_2$, nano-electromechanical switches, or carbon nanotube transistors. The selector devices 141 and 142 may be in-plane devices such as planar transistors or finFETs, or vertical transistors such as vertical nanowires.

The selector devices 141 and 142 may be formed on top of the memory element pillars, at the same level as the second layer, and/or between the pillars. By employing selector devices that are not arranged in the substrate 100, the selector devices 141 and 142 may be formed in a subsequent BEOL process after the stack of the first and second layers 110 and 120, or even the memory element pillars 11 and 12, have been formed. A further advantage is that by arranging the selector devices 141 and 142 above, or at the same level as the pillars 11 and 12, the memory elements may be contacted from above and thereby be individually associated with a respective internal node. This is advantageous over architectures in which the selector devices are arranged in the substrate, requiring the memory element pillars to be electrically separated all the way down to the substrate or contact via structures providing a connection between the substrate and the top level of the stack.

FIG. 3 shows an embodiment in which the memory device 10 comprises a first memory element 11 and a second memory element 12 connected to a common source line SL from below. The selector devices, 141 and 142, are represented by two transistor structures that are arranged above their respective memory elements, 11 and 12, and are connected to their respective bit lines, BL1 and BL2. Each one of the selector devices 141 and 142 is in turn connected to a respective word line, WL1 or WL2, to allow individual and separate access to each of the memory elements 11 and 12. Thus, the first word line WL1 may be activated to address the first memory element 11 and the second word line WL2 to address the second memory element 12. In other words, the internal node, or the node between the selector device and the memory element may be unique for each cell.

The disclosed technology may be employed in an array architecture comprising an array of memory elements or cells 11 and 12, each of which being associated with a selector device. The array may comprise m rows and n columns of cells, wherein each cell may be arranged at the intersection of a word line $WL_m$ and a bit line $BL_n$.

FIG. 4 shows a memory device 20 according to an embodiment of the disclosed technology. The memory device 20 comprises a plurality of arrays or plates 261, 262, 263, and 264 of memory elements, similar to the plates discussed with reference to the above embodiments. Each one of the plates 261-264 may be defined by a plurality of memory elements that are interconnected within the plate by a shared or common bottom layer, i.e., the first layer (and, possibly, bottom electrode), as previously discussed. FIG. 4 will now be described in detail with reference to nine levels or layers L1-L9, counted from the substrate 100 and upwards.

L1 is represented by the substrate 100, onto which a second layer L2 may be arranged, comprising, e.g., transistors for peripheral functions such as sense amplifiers and write drivers. The third level L3 is an interconnect layer for connecting the above layers to the second layer L2. The fourth layer L4 is a first memory element layer comprising a first and a second plate, 261 and 262, of interconnected group of memory elements. These memory elements may be MTJ memory elements as already discussed. The fourth layer L4 may further comprise interconnect structures, such as VIAs, connecting the above layers with lower interconnects. A fifth layer L5 may be arranged above the first memory element layer L4, and may comprise cell selector devices and their interconnect structures. The plates 261 and 262 of the fourth layer L4 may be individually connected to a respective source line through the second layer L2, whereas each one of the memory elements within the plates 261 and 262 may be individually addressed by the selector elements arranged in the fifth layer L5.

The above structure, i.e., the layers L2-L5, may be repeated in a similar manner for the next layers L6-L9, which hence may comprise a second interconnect layer L6, a second memory element layer L7, which may be similar to the first memory element layer L4 and thus comprise a third and a fourth plate, 163 and 164, of interconnected group of memory elements, an eight layer L8 comprising cell selector devices, and a ninth layer L9 comprising interconnect structures.

Figure 5:
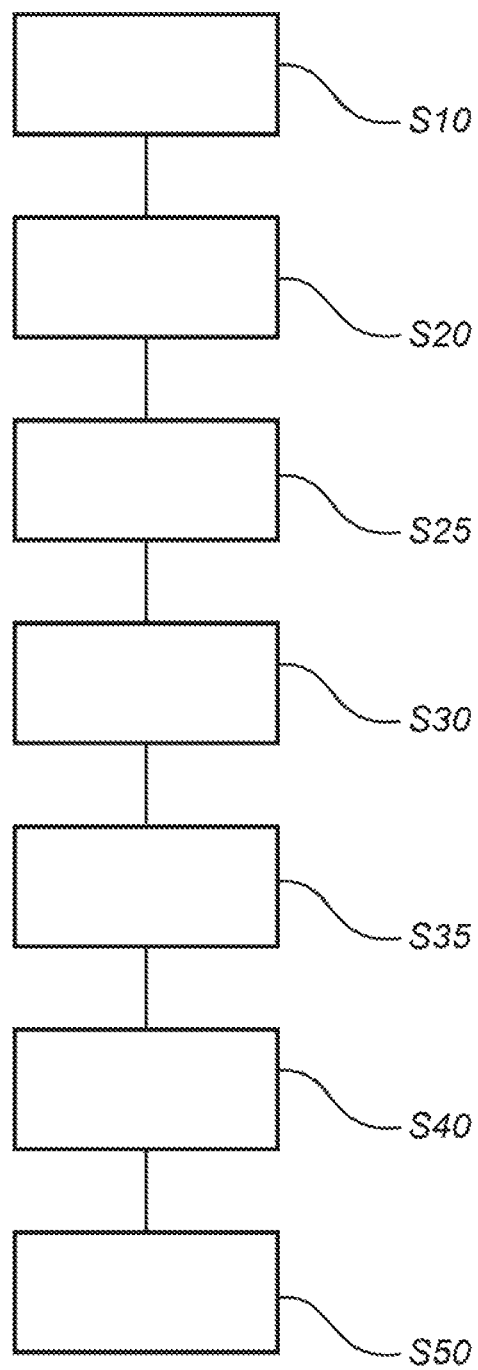
FIG. 5 is a flowchart schematically illustrating a method of manufacturing a memory device according to certain embodiments.

FIG. 5 is a flow chart schematically illustrating a method of manufacturing a memory device according to some embodiment. The memory device may be similarly configured as the memory devices 10 and 20 disclosed above in connection with FIGS. 1-4.

Hence, according to an embodiment, the method may comprise the steps of providing S10 a substrate 100, and providing S20 a first layer 110 and a second layer 120, wherein the first layer 110 is arranged between the substrate 100 and the second layer 120. Furthermore, a barrier layer 130 may be provided S25 between the first layer 110 and the second layer 120. In a subsequent step, the second layer 120 may be etched S30 through to form a first memory element 11 and a second memory element 12 that are interconnected via the first layer 110 and separated from each other by a trench 150 that is formed by the etching S30 of the second layer 120. During the etching S30, the barrier layer 130 may be used as an etch stop layer. Furthermore, the method may comprise the steps of providing S40 a first selector element 141 arranged to contact the first memory element 11 providing S50 a second selector element 142 arranged to contact the second memory element 12, wherein the first selector device 141 and the second selector device 142 may be arranged in or above the second layer 120 of the respective memory elements 11 and 12. The first selector device 141 and the second selector device 142 may be formed by means of a thin film methodology, resulting in, e.g., IGZO transistors, or a monolithic 3D integration process.

In the above, the invention has mainly been described with reference to a limited number of examples. However, as is readily appreciated by a person skilled in the art, other examples than the ones disclosed above are equally possible within the scope of the invention.

What is claimed is:

1. A memory device, comprising:
   a substrate;
   a first memory element;
   a second memory element;
   a third memory element, wherein the first memory element, the second memory element, and the third memory element are formed of a stack comprising at least a first layer and a second layer, the first layer being arranged between the substrate and the second layer, the first memory element, the second memory element, and the third memory element are interconnected via the first layer, and the first memory element, the second memory element, and the third memory element are separated from each other by trenches formed in the second layer, and wherein the first memory element, the second memory element, and the third memory element are arranged to be noncollinear and as part of an array having X rows and Y columns, wherein X is a natural number greater than 1 and Y is a natural number greater than 1 and the array is electrically interconnected;
a first selector device arranged to contact the first memory element;
a second selector device arranged to contact the second memory element; and
a third selector device arranged to contact the third memory element, wherein the first selector device, the second selector device, and the third selector device are arranged in or above the second layer.

2. The memory device according to claim 1, further comprising a third layer arranged between the first layer and the second layer.

3. The memory device according to claim 2, wherein:
the first layer is a first magnetic layer;
the second layer is a second magnetic layer; and
the third layer is a barrier layer, wherein the first magnetic layer, the second magnetic layer, and the barrier layer form a magnetic tunnel junction (MTJ) structure.

4. The memory device according to claim 3, wherein:
the first magnetic layer has a fixed magnetization direction and the second magnetic layer is configured to switch its magnetization direction with respect to the magnetization direction of the first magnetic layer; or
the second magnetic layer has a fixed magnetization direction and the first magnetic layer is configured to switch its magnetization direction with respect to the magnetization direction of the second magnetic layer.

5. The memory device according to claim 3, wherein the first memory element, the second memory element, and the third memory element are interconnected via the barrier layer.

6. The memory device according to claim 1, wherein each one of the first selector device, the second selector device, and the third selector device is a thin film device.

7. The memory device according to claim 1, wherein each one of the first selector device, the second selector device, and the third selector device is a monolithic 3D integrated device.

8. The memory device according to claim 1, wherein each one of the first selector device, the second selector device, and the third selector device comprises a planar transistor or a vertical transistor.

9. The memory device according to claim 1, wherein:
each one of the first selector device, the second selector device, and the third selector device is a three terminal device having a first terminal connected to the second layer of its respective memory element, a second terminal connected to a respective bit line, and a third terminal connected to a respective word line; and
the first memory element, the second memory element, and the third memory element are connected, via the first layer, to a common source line.

10. The memory device according to claim 4, wherein the first memory element, the second memory element, and the third memory element are interconnected via the barrier layer.

11. The memory device according to claim 2, wherein each one of the first selector device, the second selector device, and the third selector device is a thin film device.

12. The memory device according to claim 2, wherein each one of the first selector device, the second selector device, and the third selector device is a monolithic 3D integrated device.

13. The memory device according to claim 2, wherein each one of the first selector device, the second selector device, and the third selector device comprises a planar transistor or a vertical transistor.

14. The memory device according to claim 1, wherein trenches are not formed in the first layer.

15. The memory device according to claim 1, wherein the two-dimensional array comprises m rows and n columns of memory elements, m word lines, and n bit lines, and wherein each memory element is arranged at the intersection of a word line and a bit line to allow individual and separate access to each of the memory elements.

16. The memory device according to claim 1, further comprising a bottom electrode arranged between the substrate and the first layer, wherein trenches are not formed in either the first layer or the bottom electrode.

17. A stack of plates, each plate comprising an array of memory devices according to claim 1, wherein the plates are stacked in a plurality of levels along a vertical direction.

18. A stack of plates, each plate comprising an array of memory devices according to claim 4, wherein the plates are stacked in a plurality of levels along a vertical direction.

19. A stack of plates, each plate comprising an array of memory devices according to claim 9, wherein the plates are stacked in a plurality of levels along a vertical direction.

20. A method of manufacturing a memory device, comprising:
providing a substrate;
providing a first layer and a second layer, the first layer being arranged between the substrate and the second layer;
etching through the second layer to form a first memory element, a second memory element, and a third memory element, wherein the first memory element, the second memory element, and the third memory element are interconnected via the first layer, and are separated from each other by trenches formed in the second layer, and wherein the first memory element, the second memory element, and the third memory element are arranged to be noncollinear and as part of an array having X rows and Y columns, wherein X is a natural number greater than 1 and Y is a natural number greater than 1 and the array is electrically interconnected;
providing a first selector device arranged to contact the first memory element;
providing a second selector device arranged to contact the second memory element; and
providing a third selector device arranged to contact the third memory element, wherein the first selector device, the second selector device, and the third selector device are arranged in or above the second layer.

21. The method according to claim 20, further comprising:
providing a barrier layer arranged between the first layer and the second layer.

22. The method according to claim 21, further comprising:
using the barrier layer as an etch stop layer when etching through the second layer.

23. The method according to claim 22, wherein the first layer is a first magnetic layer and the second layer is a second magnetic layer, the first magnetic layer, the second magnetic layer, and the barrier layer forming a magnetic tunnel junction (MTJ) structure.

24. The method according to claim 20, wherein the first selector device, the second selector device, and the third selector device are formed in a thin film process.

25. The method according to claim 20, wherein the first selector device, the second selector device, and the third selector device are formed in a monolithic 3D integration process.

26. The method according to claim 21, wherein the first selector device, the second selector device, and the third selector device are formed in a thin film process.

27. The method according to claim 20, wherein the first layer is non-etched on a plate.

28. The method according to claim 27, wherein the plate is one of a plurality of plates in the first layer that are not connected.

29. The method according to claim 20, wherein the two-dimensional array comprises m rows and n columns of memory elements, m word lines, and n bit lines, and wherein each memory element is arranged at the intersection of a word line and a bit line to allow individual and separate access to each of the memory elements.

* * * * *